United States Patent
Park et al.

(10) Patent No.: US 9,991,126 B2
(45) Date of Patent: Jun. 5, 2018

(54) SEMICONDUCTOR DEVICE INCLUDING AN ELECTRICALLY FLOATED DUMMY CONTACT PLUG AND A METHOD OF MANUFACTURING THE SAME

(71) Applicant: SAMSUNG ELECTRONICS CO., LTD., Suwon-si, Gyeonggi-Do (KR)

(72) Inventors: Dong-Sik Park, Suwon-si (KR); Won-Chul Lee, Seongnam-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days. days.

(21) Appl. No.: 15/447,969

(22) Filed: Mar. 2, 2017

(65) Prior Publication Data

US 2017/0256411 A1   Sep. 7, 2017

(30) Foreign Application Priority Data

Mar. 3, 2016   (KR) .......................... 10-2016-0025770

(51) Int. Cl.
*H01L 21/30*   (2006.01)
*H01L 21/768*   (2006.01)
(Continued)

(52) U.S. Cl.
CPC .... *H01L 21/3003* (2013.01); *H01L 21/76816* (2013.01); *H01L 21/76849* (2013.01);
(Continued)

(58) Field of Classification Search
CPC .......... H01L 21/3003; H01L 21/76816; H01L 21/76849; H01L 21/76852; H01L 23/5226;
(Continued)

(56) References Cited

U.S. PATENT DOCUMENTS 6,468,894 B1   10/2002   Yang et al.
7,446,362 B2   11/2008   Hidaka et al.
(Continued)

FOREIGN PATENT DOCUMENTS

JP   2004-342724   12/2004
JP   2006-108318   4/2006
(Continued)

*Primary Examiner* — Shahed Ahmed
(74) *Attorney, Agent, or Firm* — F. Chau & Associates, LLC

(57) ABSTRACT

A semiconductor device includes a substrate; a hydrogen insulating layer disposed on the substrate and including hydrogen ions; a first level layer disposed on the substrate and including a first wire and a second wire; a second level layer disposed on the substrate at a different level from the first level layer and including a third wire; an interlayer insulating layer disposed between the first level layer and the second level layer; a diffusion prevention layer contacting the third wire; a contact plug penetrating the interlayer insulating layer and electrically connecting the second wire to the third wire; and a dummy contact plug penetrating the interlayer insulating layer. The dummy contact plug contacts the first and second level layers, is spaced apart from the diffusion prevention layer, and is configured to provide a movement path for the hydrogen ions in the hydrogen insulating layer.

14 Claims, 23 Drawing Sheets

100A

(51) Int. Cl.
*H01L 23/522* (2006.01)
*H01L 23/528* (2006.01)
*H01L 23/532* (2006.01)
*H01L 29/34* (2006.01)

(52) U.S. Cl.
CPC ...... *H01L 21/76852* (2013.01); *H01L 23/528* (2013.01); *H01L 23/5226* (2013.01); *H01L 23/5329* (2013.01); *H01L 29/34* (2013.01)

(58) Field of Classification Search
CPC ... H01L 23/528; H01L 23/5329; H01L 29/34; H01L 21/67138; H01L 21/823475; H01L 21/823871; H01L 2027/11875; H01L 28/57
USPC ..... 257/377, 774, 756; 438/6, 128, 598, 617
See application file for complete search history.

(56) References Cited

U.S. PATENT DOCUMENTS

| | | | |
|---|---|---|---|
| 7,459,787 B2 | 12/2008 | Young | |
| 7,524,738 B2 | 4/2009 | Lee | |
| 7,678,714 B2 | 3/2010 | Ikebuchi | |
| 7,781,335 B2 | 8/2010 | Isono | |
| 8,841,195 B2 | 9/2014 | Sun et al. | |
| 8,987,907 B2 | 3/2015 | Kang et al. | |
| 9,048,156 B2 | 6/2015 | Koike | |
| 2008/0093704 A1* | 4/2008 | Park | H01L 23/564 257/529 |
| 2008/0105911 A1* | 5/2008 | Wang | H01L 27/11502 257/295 |
| 2010/0244254 A1 | 9/2010 | Kobayashi et al. | |
| 2011/0201198 A1* | 8/2011 | Jung | H01L 21/76849 438/653 |
| 2012/0146183 A1 | 6/2012 | Lee et al. | |
| 2012/0261747 A1 | 10/2012 | Park et al. | |
| 2012/0318567 A1 | 12/2012 | Park et al. | |
| 2013/0147022 A1 | 6/2013 | Yoon et al. | |
| 2013/0241065 A1 | 9/2013 | Kang et al. | |
| 2017/0005100 A1 | 1/2017 | Cho et al. | |

FOREIGN PATENT DOCUMENTS

| | | |
|---|---|---|
| JP | 2006-344773 | 12/2006 |
| JP | 2008-108761 | 5/2008 |
| KR | 10-2001-0060038 | 7/2001 |
| KR | 10-0640535 | 10/2006 |
| KR | 10-2012-0118323 | 10/2012 |
| KR | 10-2013-0138532 | 12/2013 |
| KR | 10-2017-0004502 | 1/2017 |

\* cited by examiner

SEMICONDUCTOR DEVICE INCLUDING AN ELECTRICALLY FLOATED DUMMY CONTACT PLUG AND A METHOD OF MANUFACTURING THE SAME

CROSS-REFERENCE TO RELATED APPLICATION

This application claims priority under 35 U.S.C. § 119 to Korean Patent Application No. 10-2016-0025770, filed on Mar. 3, 2016 in the Korean Intellectual Property Office, the disclosure of which is incorporated by reference herein in its entirety.

TECHNICAL FIELD

The inventive concept relates to a semiconductor device and a method of manufacturing the same.

DISCUSSION OF RELATED ART

Semiconductor devices have become highly integrated. Due to the complexity of design and manufacturing processes as well as miniaturization of the semiconductor devices, substrates therein may become damaged. Accordingly, dangling bonds of silicon in the substrates may increase and become sources of leakage currents of electrons. This leakage current may negatively impact the operation speed and refresh characteristics of the semiconductor device.

SUMMARY

Exemplary embodiments of the inventive concept provide a semiconductor device. The semiconductor device includes a substrate, a hydrogen insulating layer, a first level layer, a second level layer, an interlayer insulating layer, a diffusion prevention layer, a contact plug, and a dummy contact plug. The hydrogen insulating layer is disposed on the substrate. The hydrogen insulating layer includes hydrogen ions. The first level layer is disposed on the substrate. The first level layer includes a first wire and a second wire. The second level layer is disposed on the substrate and at a different level from the first level layer. The second level layer includes a third wire. The interlayer insulating layer is disposed between the first level layer and the second level layer. The diffusion prevention layer contacts the third wire. The contact plug penetrates the interlayer insulating layer. The contact plug electrically connects the second wire to the third wire. The dummy contact plug penetrates the interlayer insulating layer. The dummy contact plug contacts the first level layer and the second level layers. The dummy contact plug is spaced apart from the diffusion prevention layer. The dummy contact plug is configured to provide a movement path for the hydrogen ions in the hydrogen insulating layer.

Exemplary embodiments of the inventive concept provide a semiconductor device. The semiconductor device includes a substrate, a first level layer, a hydrogen insulating layer, a first contact plug, and at least one first dummy contact plug. At least one unit element is disposed on the substrate. The first level layer is disposed on the substrate. The first level layer includes at least one first wire. The hydrogen insulating layer is disposed on the first level layer. The hydrogen insulating layer includes hydrogen ions. The first contact plug electrically connects the at least one first wire to the at least one unit element. The at least one first dummy contact plug contacts the at least one first wire and the substrate. The at least one first dummy contact plug is electrically separated from the at least one unit element. The at least one first dummy contact plug is electrically floated. The at least one first dummy contact plug is configured to provide a movement path for the hydrogen ions in the hydrogen insulating layer.

Exemplary embodiments of the inventive concept provide a method of manufacturing a semiconductor device. The method includes forming a first level layer on a substrate. The first level layer includes a first wire and a second wire. An interlayer insulating layer is formed on the first level layer. A contact plug and a dummy contact plug are formed to penetrate the interlayer insulating layer. A second level layer is formed on the interlayer insulating layer. The second level layer includes a third wire. A diffusion prevention layer is formed on the third wire. A hydrogen insulating layer is formed on the second layer. The hydrogen insulating layer includes hydrogen ions. The contact plug is configured to electrically connect the second wire to the third wire. The dummy contact plug is spaced apart from the diffusion prevention layer.

BRIEF DESCRIPTION OF THE DRAWINGS

The above and/or other features of the inventive concept will become more apparent by describing in detail exemplary embodiments thereof with reference to the accompanying drawings, in which.

DETAILED DESCRIPTION OF THE EMBODIMENTS

Figure 1:
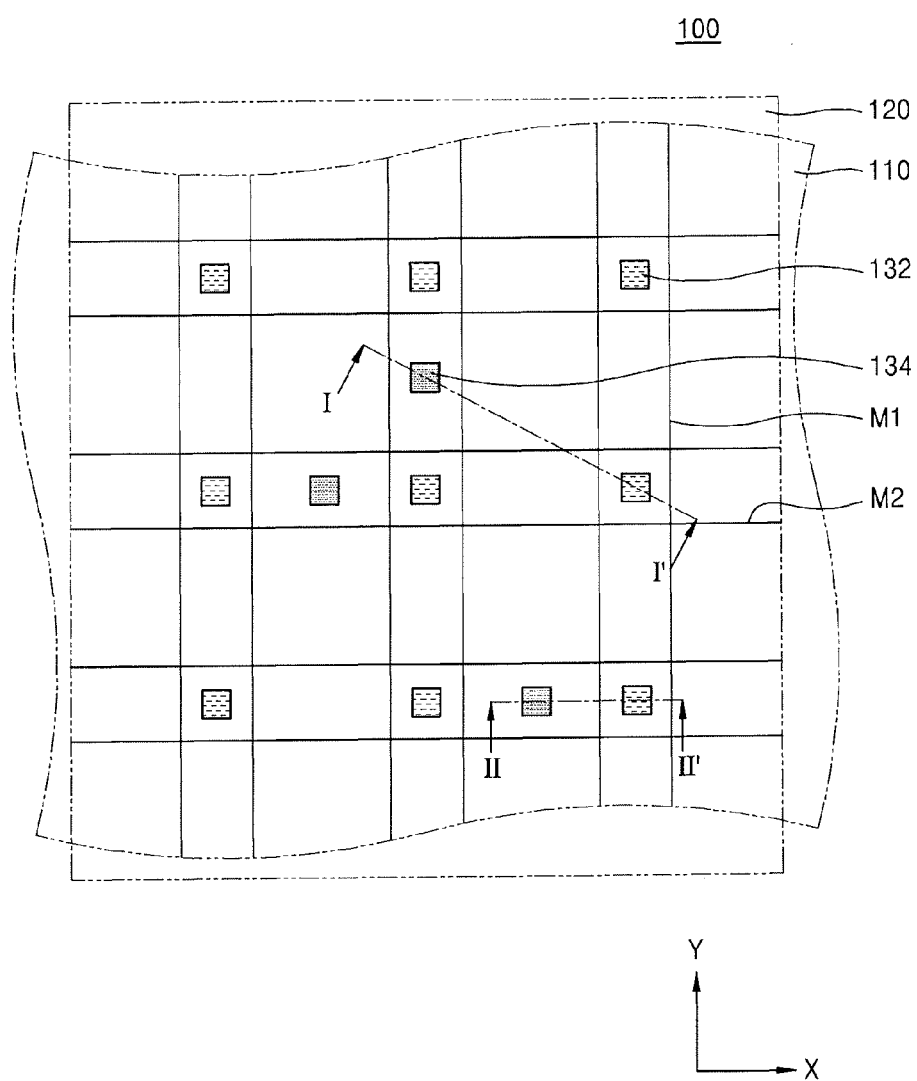
FIG. 1 is a layout view illustrating a semiconductor device according to an exemplary embodiment of the inventive concept.

FIG. 1 is a layout view illustrating a semiconductor device 100 according to an exemplary embodiment of the inventive concept.

FIG. 1 illustrates an arrangement of wires. The arrangement of wires may be formed on and/or in a substrate on a portion of the semiconductor device 100. Referring to FIG. 1, the semiconductor device 100 may include a first level layer 110. The semiconductor device 100 may further include a second level layer 120. A wire M1 formed in the first level layer 110 may extend in a first direction, for example, a y-axis direction. The wire M1 formed in the first level layer 110 may be arranged in a second direction, for example, an x-axis direction. A wire M2 formed in the second level layer 120 may extend in the second direction. The wire M2 formed in the second level layer 120 may be arranged in the first direction. The first level layer 110 and the second level layer 120 may be formed on different levels with respect to the substrate. The first direction and the second direction may be substantially perpendicular to each other; however, embodiments of the inventive concept are not limited thereto. The first direction and the second direction may be different directions crossing at angles of greater or less than 90°.

The semiconductor device 100 may further include contact plugs 132. The contact plugs 132 may be configured to electrically connect the wire M1 formed in the first level layer 110 and the wire M2 formed in the second level layer 120. The semiconductor device 100 may further include dummy contact plugs 134. The dummy contact plugs 134 may be configured to contact the first level layer 110 and the second level layer 120. The dummy contact plugs 134 may be electrically floated. The dummy contact plug 134 may contact the wire M1 formed in the first level layer 110. Alternatively, the dummy contact plug 134 may contact the wire M2 formed on the second level layer 120.

As illustrated in FIG. 1, the contact plug 132 and the dummy contact plug 134 may have a square shape; however, exemplary embodiments of the inventive concept are not limited thereto. The wire M1 formed in the first level layer 110 and the wire M2 formed in the second level layer 120 may have substantially the same line width. However, exemplary embodiments of the inventive concept are not limited thereto.

Figure 2A:
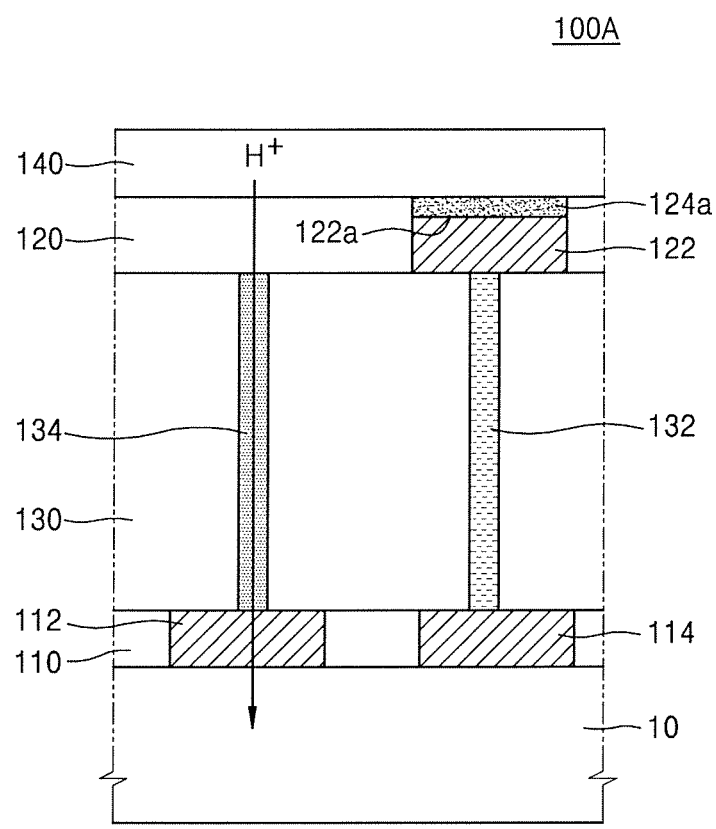
FIGS. 2A and 2B are side cross-sectional views along a line I-I' of FIG. 1 according to an exemplary embodiment of the inventive concept.
Figure 2B:
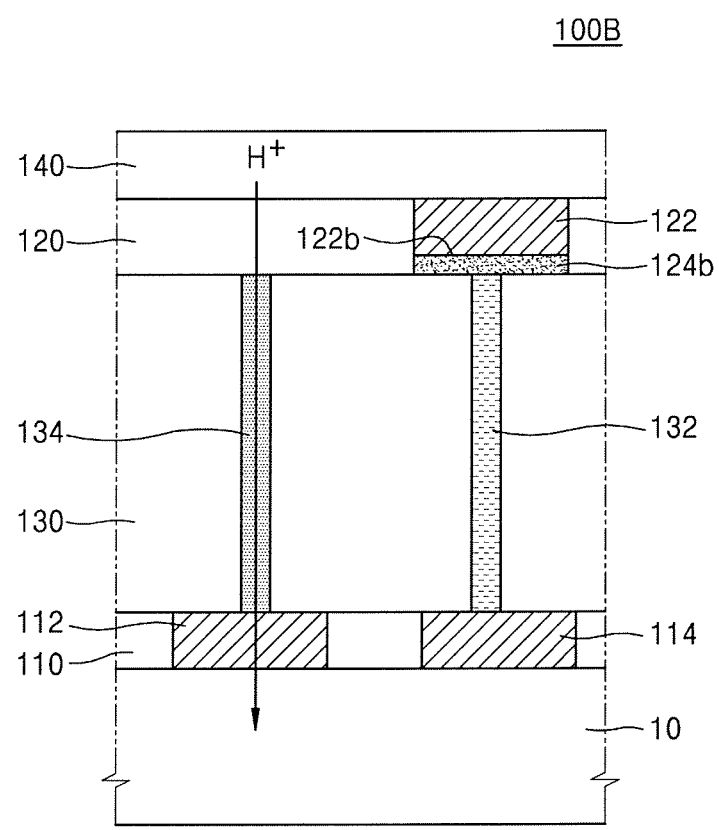

FIGS. 2A and 2B are side cross-sectional views along a line I-I' of FIG. 1. FIGS. 2A and 2B respectively illustrate a semiconductor device 100A and 100B according to an exemplary embodiment of the inventive concept.

Referring to FIG. 2A, the semiconductor device 100A may include the substrate 10, the first level layer 110, the second level layer 120, an interlayer insulating layer 130, and a hydrogen insulating layer 140.

The semiconductor device 100A may also include a diffusion prevention layer 124a, a contact plug 132, and a dummy contact plug 134. The dummy contact plug 134 may be spaced apart from the diffusion prevention layer 124a. The dummy contact plug 134 may provide a movement path for hydrogen (H) ions in the hydrogen insulating layer 140.

The substrate 10 may be a semiconductor wafer. The substrate 10 may include silicon (Si); however, exemplary embodiments of the inventive concept are not limited thereto. According to an exemplary embodiment of the inventive concept, the substrate 10 may include a semiconductor element such as germanium (Ge). Alternatively, the substrate 10 may include compound semiconductors such as silicon carbide (SiC), gallium arsenide (GaAs), indium arsenide (InAs), and indium phosphide (InP). However, exemplary embodiments of the inventive concept are not limited thereto. According to an exemplary embodiment of the inventive concept, the substrate 10 may include a silicon-on-insulator (SOI) structure. For example, the substrate 10 may include a buried oxide layer (BOX). According to an exemplary embodiment of the inventive concept, the substrate 10 may include a conductive area, for example, an area doped with impurities or a structure doped with impurities. The substrate 10 may include various element isolation structures, such as a shallow trench isolation (STI) structure.

The first level layer 110, the interlayer insulating layer 130, the second level layer 120, and the hydrogen insulating layer 140 may be formed on the substrate 10.

A detailed method of manufacturing the semiconductor device will be described with reference to FIGS. 5A to 5G.

The first level layer 110 may be formed on the substrate 10. The first level layer 110 may include a first wire 112. The first level layer 110 may further include a second wire 114. The first wire 112 and the second wire 114 may each include metallic materials, for example, copper (Cu), aluminum (Al), tungsten (W), titanium (Ti), titanium nitride (TiN), tungsten nitride (WN), tantalum (Ta), TaN, or TiAlN, or a combination thereof; however, exemplary embodiments of the inventive concept are not limited thereto. The second wire 114 may be electrically connected to a third wire 122 of the second level layer 120 via the contact plug 132. Portions of the first level layer 110 except portions corresponding to the first and second wires 112 and 114 may include substantially the same material as the interlayer insulating layer 130 or the hydrogen insulating layer 140 to be described below.

The second level layer 120 may include the third wire 122. The second level layer 120 may be formed at a level above the first level layer 110 with respect to the substrate 10. The third wire 122 may include substantially the same material as the first wire 112 and the second wire 114. Portions of the second level layer 120 except a portion corresponding to the third wire 122 may include substantially the same material as the interlayer insulating layer 130 or the hydrogen insulating layer 140. According to FIG. 2A, cross-sections of the first wire 112, the second wire 114, and the third wire 122 may have substantially the same width; however, exemplary embodiments of the inventive concept are not limited thereto. The widths of the cross-sections of the first wire 112, the second wire 114, and the third wire 122 may vary. For example, the first wire 112 and the second wire 114 may have the same width as each other, but different from the third wire 122.

The interlayer insulating layer 130 may be formed between the first level layer 110 and the second level layer 120. The interlayer insulating layer 130 may be a single layer or a multi-layer structure. The interlayer insulating layer 130 may include an oxide. The interlayer insulating layer 130 may include boro-phospho-silicate glass (BPSG), tonen silazene (TOSZ), undoped silicate glass (USG), spin-on glass (SOG), flowable oxide (FOX), tetraethylortho silicate (TEOS), high density plasma chemical vapor deposition (HDP CVD) oxide, hydrogen silisesquioxane (HSQ), or the like.

The hydrogen insulating layer 140 may be formed on the substrate 10. The hydrogen insulating layer 140 may include hydrogen (H) ions. The hydrogen insulating layer 140 may be formed at a level above the second level layer 120 with respect to the substrate 10. The hydrogen insulating layer 140 may include insulating materials including hydrogen (H), for example, hydrogen silsesquioxane (HSQ), tetraethyl orthosilicate (TEOS), high density plasma chemical vapor deposited (HDP-CVD) oxide, or the like The hydrogen insulating layer 140 may provide hydrogen (H) ions. The hydrogen insulating layer 140 may also move the hydrogen (H) ions towards the substrate 10 via the dummy contact plug 134 or the like.

The diffusion prevention layer 124a may contact the third wire 122. The diffusion prevention layer 124a may prevent metallic materials in the third wire 122 from diffusing during a manufacturing process of the semiconductor device 100A. The diffusion prevention layer 124a may cover an upper surface 122a of the third wire 122. The diffusion prevention layer 124a may include a metallic material such as titanium (Ti) and/or tantalum (Ta) and a nitride such as titanium nitride (TiN), tantalum nitride (TaN), and/or cobalt nitride (CoN), or a combination thereof. However, exemplary embodiments of the inventive concept are not limited thereto. The diffusion prevention layer 124a may disturb a flow of the hydrogen (H) ions of the hydrogen insulating layer 140.

The contact plug 132 may penetrate the interlayer insulating layer 130. The contact plug 132 may electrically connect the second wire 114 to the third wire 122. The contact plug 132 may include a conductive material, for example, aluminum (Al), copper (Cu), an Al—Cu alloy, tungsten silicide (WSi), titanium tungsten (TiW), tantalum (Ta), molybdenum (Mo), tungsten (W), doped polysilicon (poly-Si), or a combination thereof. A shape of a cross-section of the contact plug 132 may vary.

The dummy contact plug 134 may penetrate the interlayer insulating layer 130. The dummy contact plug 134 may contact the first level layer 110. The dummy contact plug 134 may also contact the second level layer 120. A lower surface of the dummy contact plug 134 may contact the first wire 112. However, exemplary embodiments of the inventive concept are not limited thereto. The dummy contact plug 134 might not contact wires formed in the second level layer 120. Therefore, the dummy contact plug 134 may be electrically floated.

The dummy contact plug 134 may be spaced apart from the diffusion prevention layer 124a. Since a movement of the hydrogen (H) ions may be disturbed by the diffusion prevention layer 124a, the dummy contact plug 134 that is spaced apart from the diffusion prevention layer 124a may provide a new movement path for the hydrogen (H) ions.

The dummy contact plug 134 may include substantially the same material as the contact plug 132. FIG. 2A illustrates the dummy contact plug 134 and the contact plug 132 have substantially the same width; however, exemplary embodiments of the inventive concept are not limited thereto. A width of the dummy contact plug 134 and a width of the contact plug 132 may be different. In addition, the shape of a cross-section of the dummy contact plug 134 may vary.

Referring to FIG. 2B, the semiconductor device 100B may include the substrate 10, the first level layer 110, the second level layer 120, the interlayer insulating layer 130, and the hydrogen insulating layer 140. The first wire 112 may be formed in the first level layer 110. The second wire 114 may also be formed in the first level layer 110. The third wire 122 may be formed in the second level layer 120. The semiconductor device 100B may include a diffusion prevention layer 124b, the contact plug 132, and the dummy contact plug 134. A detailed method of manufacturing the memory device 100B will be described with reference to FIGS. 5A to 5G. Hereinafter, the descriptions already provided with reference to FIG. 2A may not be repeated.

The diffusion prevention layer 124b may contact the third wire 122. The diffusion prevention layer 124b may prevent metallic materials in the third wire 122 from diffusing during a manufacturing process of the semiconductor device 100B. The diffusion prevention layer 124b may contact a lower surface 122b of the third wire 122. The diffusion prevention layer 124b may disturb a flow of the hydrogen (H) ions of the hydrogen insulating layer 140.

The dummy contact plug 134 may be spaced apart from the diffusion prevention layer 124b. Since a movement of the hydrogen (H) ions may be disturbed by the diffusion prevention layer 124b, the dummy contact plug 134 that is spaced apart from the diffusion prevention layer 124b may provide a new movement path for the hydrogen (H) ions. The dummy contact plug 134 may be electrically floated.

Figure 3:
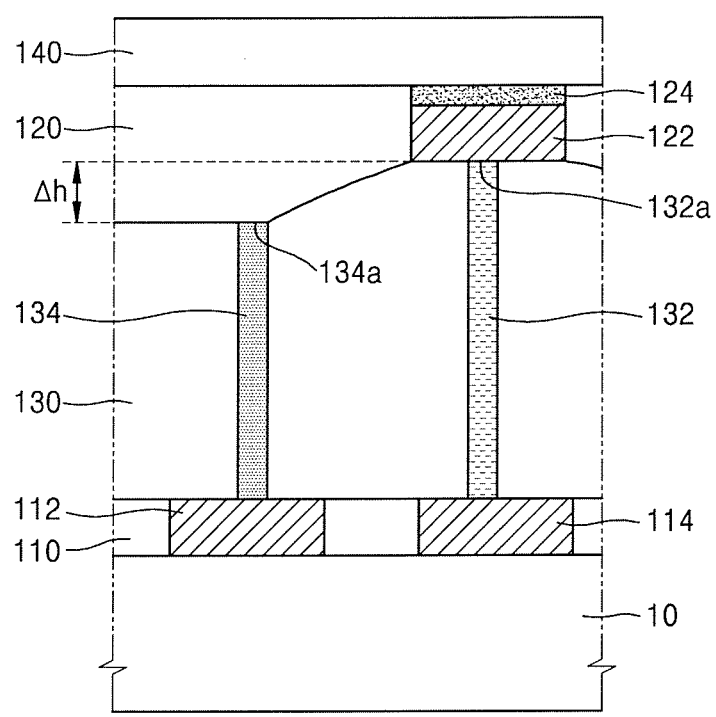
FIG. 3 is a side cross-sectional view illustrating a semiconductor device according to an exemplary embodiment of the inventive concept.

FIG. 3 is a side cross-sectional view of a semiconductor device 100C according to an exemplary embodiment of the inventive concept. FIG. 3 illustrates a difference Δh between a height of an upper surface of the contact plug 132 and a height of the dummy contact plug 134. The descriptions provided with reference to FIG. 2A may not be repeated.

Referring to FIG. 3, the semiconductor device 100C may include the substrate 10, the first level layer 110, the second level layer 120, the interlayer insulating layer 130, and the hydrogen insulating layer 140. The first wire 112 may be formed in the first level layer 110. The second wire 114 may be formed in the first level layer 110. The third wire 122 may be formed in the second level layer 120. The semiconductor device 100C may further include a diffusion prevention layer 124, the contact plug 132, and the dummy contact plug 134. The dummy contact plug 134 may be electrically floated.

The third wire 122 and the diffusion prevention layer 124 may be formed by forming a wire material film and a prevention-layer material film, respectively, and then patterning and etching the wire material film and the prevention-layer material film through photolithography. Portions of the second level layer 120 except portions corresponding to the third wire 122 and the diffusion prevention layer 124 may be filled with insulating materials. The portions of the second level layer 120 may then be etched and planarized, thereby forming the second level layer 120. If a dry etching method is used, the interlayer insulating layer 130, which may be disposed below a region where the third wire 122 is not formed, may be etched together with the wire material film. The prevention layer material film and the dummy contact plug 134 may also be etched. Therefore, an upper surface 134a of the dummy contact plug 134 may be at a lower level than an upper surface 132a of the contact plug 132 with respect to the substrate 10.

Figure 4:
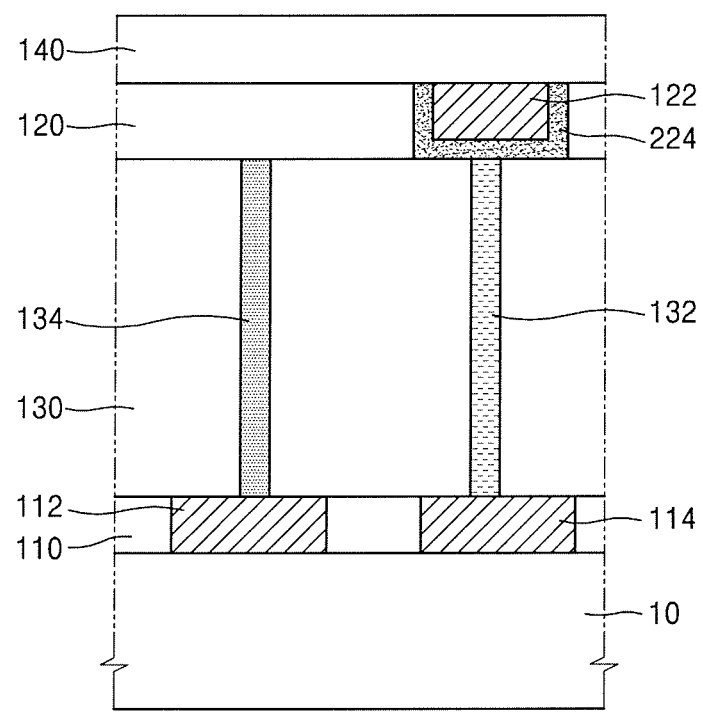
FIG. 4 is a side cross-sectional view illustrating a semiconductor device according to an exemplary embodiment of the inventive concept.

FIG. 4 is a side cross-sectional view illustrating a semiconductor device 100D according to an exemplary embodiment of the inventive concept.

Referring to FIG. 4, the semiconductor device 100D may include the substrate 10, the first level layer 110, the second level layer, the interlayer insulating layer 130, and the hydrogen insulating layer 140. The first wire 112 may be formed in the first level layer 110. The second wire 114 may be formed in the first level layer 110. The third wire 122 may be formed in the second level layer 120. The semiconductor device 100D may further include a diffusion prevention layer 224, the contact plug 132, and the dummy contact plug 134. A detailed method of manufacturing the semiconductor device 100D will be described with reference to FIGS. 5A to 5G. Hereinafter, the descriptions already provided with reference to FIG. 2A may not be repeated.

The diffusion prevention layer 224 may cover a lower surface and side surfaces of the third wire 122. The side surfaces of the third wire 122 may be lateral surfaces thereof. The diffusion prevention layer 224 may prevent metallic materials in the third wire 122 from diffusing during a manufacturing of the semiconductor device 100D. The diffusion prevention layer 224 may also disturb a flow of the hydrogen (H) ions of the hydrogen insulating layer 140.

The dummy contact plug 134 may be spaced apart from the diffusion prevention layer 224. Since a movement of the hydrogen (H) ions may be disturbed by the diffusion prevention layer 224, the dummy contact plug 134 that is spaced apart from the diffusion prevention layer 224 may provide a new movement path for the hydrogen (H) ions. The dummy contact plug 134 may be electrically floated.

FIGS. 5A to 5E are side cross-sectional views illustrating a method of manufacturing a semiconductor device according to an exemplary embodiment of the inventive concept. Referring to FIGS. 5A to 5E, a method of manufacturing a semiconductor device 100A of FIG. 2A will be described.

Figure 5A:
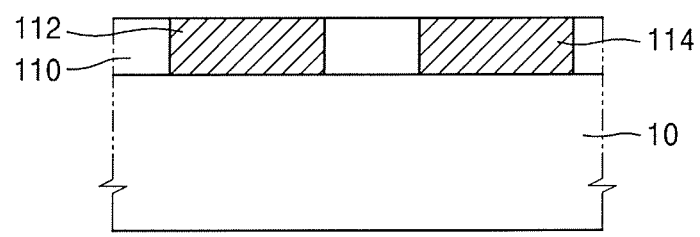
FIGS. 5A to 5E are side cross-sectional views illustrating a method of manufacturing a semiconductor device according to an exemplary embodiment of the inventive concept.

Referring to FIG. 5A, the first level layer 110 may be formed on the substrate 10. The first wire 112 may be formed on the first level layer 110. The second wire 114 may also be formed on the first level layer 110. The first wire 112 and the second wire 114 may be formed by forming a wire material film. The wire material film may be formed using methods such as chemical vapor deposition (CVD), physical vapor deposition (PVD), and atomic layer deposition (ALD). The wire material film may be patterned through photolithography to form the first wire 112 and the second wire 114. A space between the first wire 112 and the second wire 114 may be filled with an insulating material and then planarized through etching and chemical mechanical polishing (CMP).

Alternatively, when the first wire 112 and the second wire 114 include copper (Cu), a damascene process or a dual damascene process may be used. The first wire 112 and the second wire 114 may have substantially the same width or different widths.

Figure 5B:
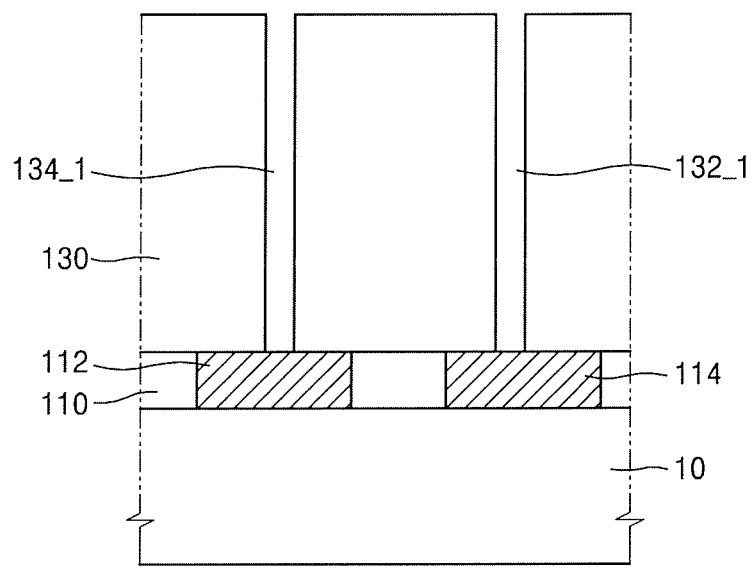

Referring to FIG. 5B, the interlayer insulating layer 130 may be formed on the first level layer 110. The interlayer insulating layer 130 may be formed through CVD, PVD such as sputtering, ALD, or the like. The interlayer insulating layer 130 may include an insulating material including hydrogen (H), for example, hydrogen silsesquioxane (HSQ), tetraethyl orthosilicate (TEOS), high density plasma chemical vapor deposited (HDP-CVD) oxide, or the like. A contact hole 132_1 may be formed on the interlayer insulating layer 130. A dummy contact hole 134_1 may be formed on the interlayer insulating layer 130. The contact hole 132_1 and the dummy contact hole 134_1 may be formed by forming a photoresist pattern and etching an exposed portion of the interlayer insulating layer 130 by using the photoresist pattern as a mask.

Figure 5C:
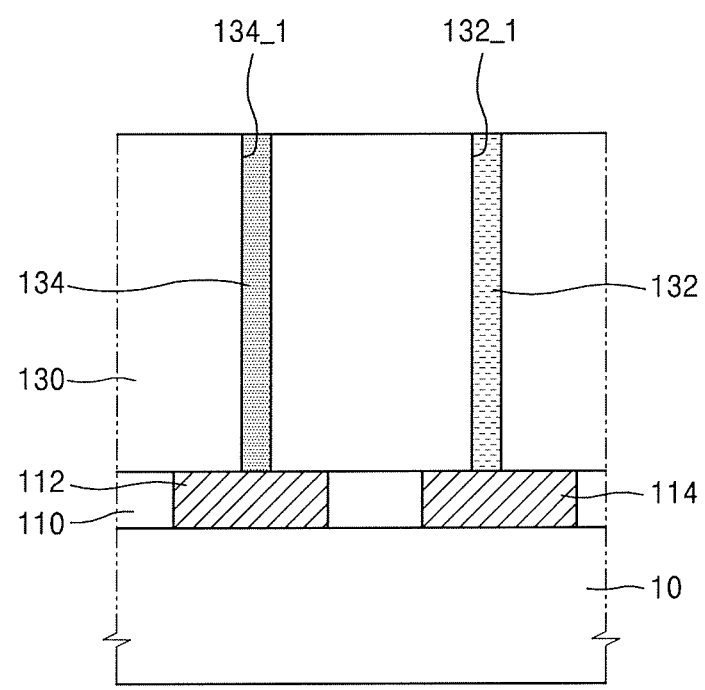

Referring to FIG. 5C, the contact hole 132_1 and the dummy contact hole 134_1 may be formed by burying the conductive material for example, aluminum (Al), copper (Cu), an Al—Cu alloy, tungsten silicide (WSi), titanium tungsten (TiW), tantalum (Ta), molybdenum (Mo), tungsten (W), doped polysilicon (poly-Si), or any combination thereof. The conductive material may be buried through CVD, PVD, ALD, or the like; however, exemplary embodiments of the inventive concept are not limited thereto. According to an exemplary embodiment of the inventive concept, a metallic seed layer may be formed on inner walls of the contact hole 132_1 and inner walls of the dummy contact hole 134_1. For example, the metallic seed layer may be grown on those inner walls. After the metallic seed layer is buried and grown, the contact plug 132 and the dummy contact plug 134 may be formed. The contact plug 132 and the dummy contact plug 134 may be planarized through CMP, etch back, or the like. The dummy contact plug 134 may be electrically floated.

Figure 5D:
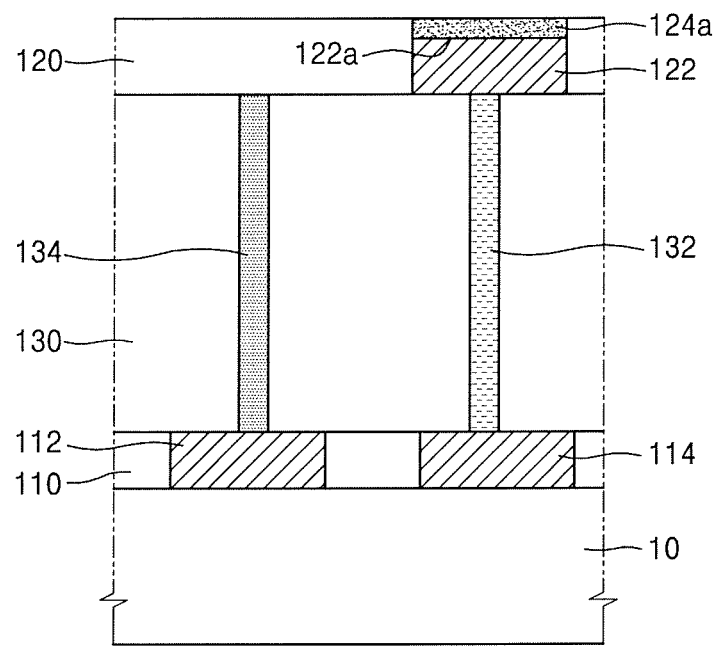

Referring to FIG. 5D, the second level layer 120 including the third wire 122 and the diffusion prevention layer 124a may be formed on the interlayer insulating layer 130. The third wire 122 and the diffusion prevention layer 124a may be formed by depositing a wire material film for forming the third wire 122 through CVD, PVD, ALD, or the like. A prevention-layer material film for forming the diffusion prevention layer 124a may be deposited on the wire material film. The wire material film and the prevention-layer material film may be patterned through photolithography. Therefore, the upper surface 122a of the third wire 122 may contact the diffusion prevention layer 124a. Portions of the second level layer 120 except a portion corresponding to the third wire 122 and the diffusion prevention layer 124a may be filled with an insulating material and planarized through etching or CMP. Accordingly, the second level layer 120 may be formed.

Figure 5E:
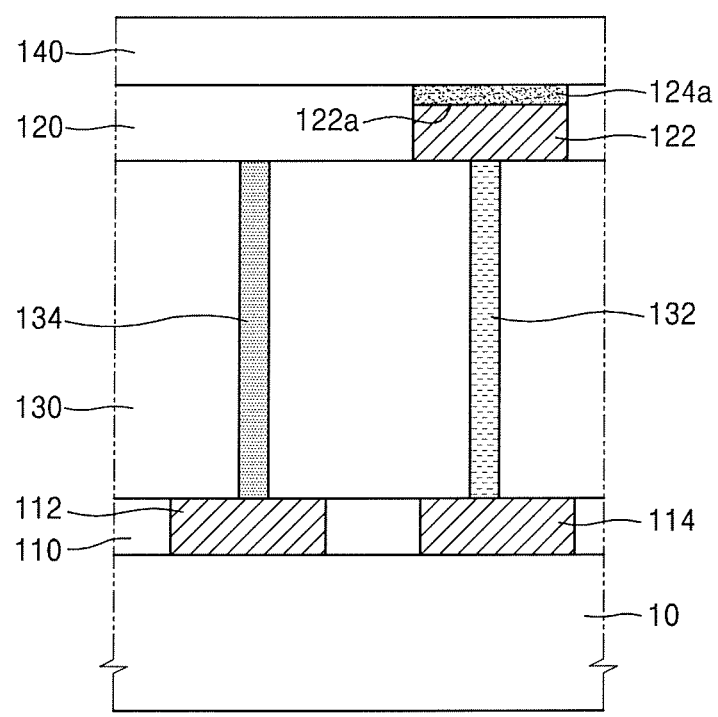

Referring to FIG. 5E, the hydrogen insulating layer 140 may be formed on the second level layer 120. The hydrogen insulating layer 140 may include hydrogen (H). For example, the hydrogen insulating layer 140 may be formed as a high density plasma (HDP) oxide layer including hydrogen (H). The hydrogen insulating layer 140 may be formed through chemical vapor deposition (CVD) after oxygen and silane gas are provided. As such, hydrogen (H) may remain in the hydrogen insulating layer 140. The hydrogen insulating layer 140 may be porous.

A method of manufacturing a semiconductor device according to an exemplary embodiment of the inventive concept may include forming the dummy contact plug that provides a movement path for hydrogen (H) ions during an operation of forming contact plugs between wires. Therefore, an additional process for forming a movement path for hydrogen (H) ions is unnecessary.

A method of manufacturing the semiconductor device 100B of FIG. 2B is described below. Descriptions of operations that are the same as the method of manufacturing the semiconductor device 100A of FIG. 2A may be omitted. Referring to FIG. 2B, the second level layer 120 including the third wire 122 and the diffusion prevention layer 124b may be formed on the interlayer insulating layer 130. The third wire 122 and the diffusion prevention layer 124b may be formed by depositing the prevention layer material film for forming the diffusion prevention layer 124b through CVD, PVD, ALD, or the like. The wire material film for forming the third wire 122 may be deposited on the prevention-layer material film. The prevention-layer material film and the wire material film may then be patterned through photolithography. Therefore, the lower surface 122b of the third wire 122 may contact the diffusion prevention layer 124b. The portions of the second level layer 120 except the portions corresponding to the third wire 122 and the diffusion prevention layer 124b may be filled with insulating materials and planarized through etching or CMP. Accordingly, the second level layer 120 may be formed.

In addition, a method of forming the semiconductor device 100D of FIG. 4 is described below. Descriptions of operations that are the same as in the method of manufacturing the semiconductor device 100A of FIG. 2A may be omitted. Referring to FIG. 4, the second level layer 120 including the third wire 122 and the diffusion prevention layer 224 may be formed on the interlayer insulating layer 130. When the third wire 122 includes copper (Cu), a damascene process or a dual damascene process may be used. Accordingly, an insulating layer of the second level layer 120 may include an insulating material. Some portions of the insulating layer may be etched through photolithography. Therefore, a trench structure may be formed in the second level layer 120. The diffusion prevention layer 224 and the third wire 122 may be deposited on the trench structure through CVD, PVD, ALD, or the like. The diffusion prevention layer 224 and the third wire 122 may be planarized through etching or CMP. Accordingly, the second level layer 120 may be formed.

Figure 6:
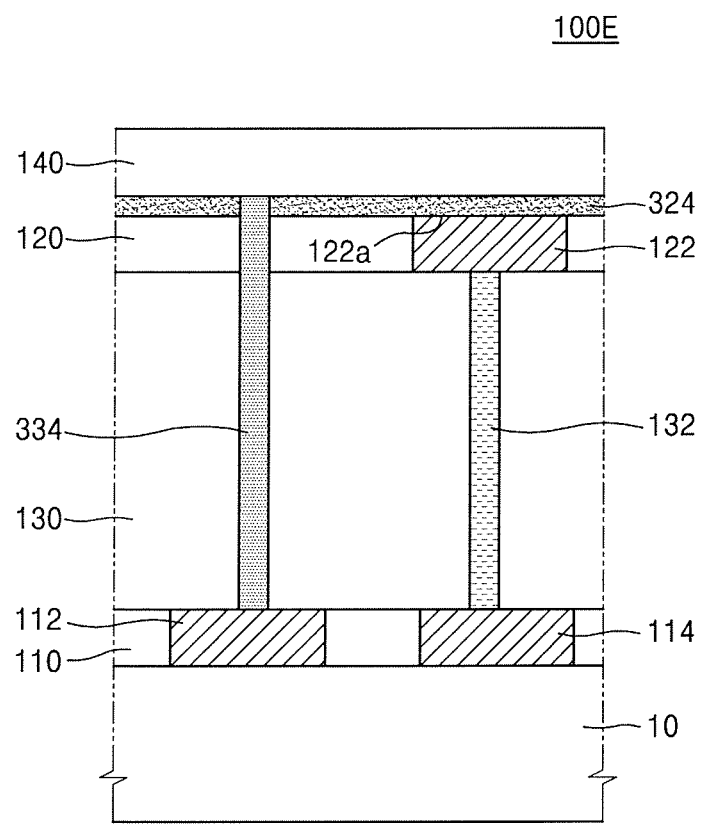
FIG. 6 is a side cross-sectional view illustrating a semiconductor device according to an exemplary embodiment of the inventive concept.

FIG. 6 is a side cross-sectional view illustrating a semiconductor device 100E according to an exemplary embodiment of the inventive concept.

Referring to FIG. 6, the semiconductor device 100E may include the substrate 10, the first level layer 110, the second level layer 120, the interlayer insulating layer 130, and the hydrogen insulating layer 140. The first wire 112 may be formed in the first level layer 110. The second wire 114 may be formed in the first level layer 110. The third level wire 122 may be formed in the second level layer 120. The semiconductor device 100E may further include an insulative diffusion prevention layer 324, the contact plug 132, and a dummy contact plug 334. Hereinafter, the descriptions already provided with reference to FIG. 2A may not be repeated.

The insulative diffusion prevention layer 324 may include an insulating material. The insulating material may include a nitride. The insulating material may contact an upper surface of the second level layer 120 including the third wire 122. However, exemplary embodiments of the inventive concept are not limited thereto. The insulative diffusion prevention layer 324 may contact a lower surface of the second level layer 120. The insulative diffusion prevention layer 324 may prevent metallic materials in the third wire 122 from diffusing during a manufacturing process of the semiconductor device 100E. The insulative diffusion layer may disturb a flow of the hydrogen (H) ions of the hydrogen insulating layer 140.

The dummy contact plug 334 may penetrate the insulative diffusion prevention layer 324. The dummy contact plug 334 may receive the hydrogen (H) ions from the hydrogen insulating layer 140. Therefore, the dummy contact plug 334 may provide a new movement path for the hydrogen (H) ions. The dummy contact plug 334 may be electrically floated.

Figure 7:
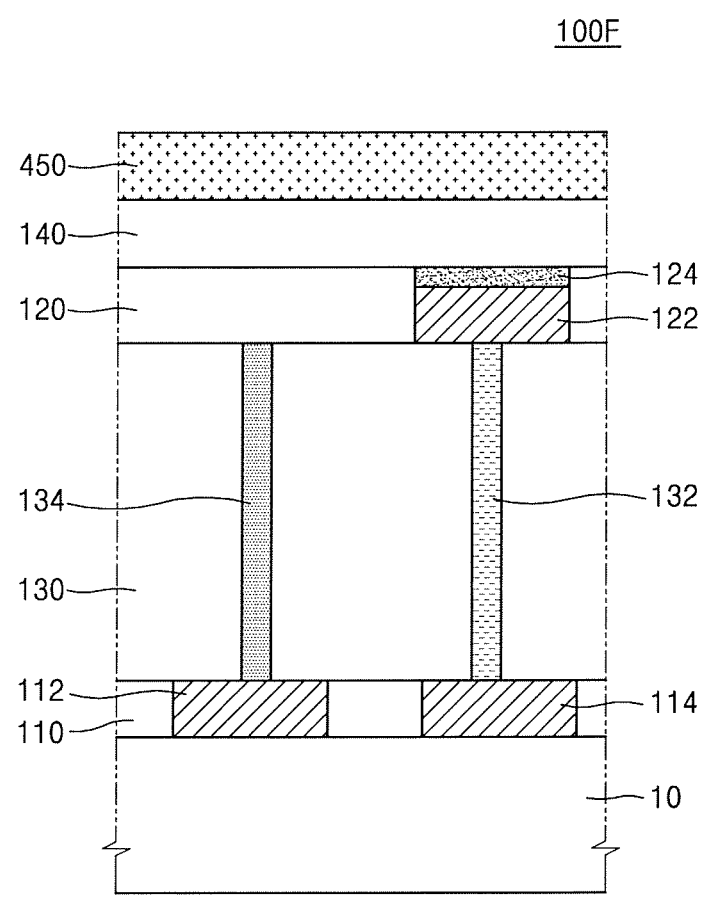
FIG. 7 is a side cross-sectional view illustrating a semiconductor device according to an exemplary embodiment of the inventive concept.

FIG. 7 is a side cross-sectional view of a semiconductor device 100F according to an exemplary embodiment of the inventive concept.

Referring to FIG. 7, the semiconductor device 100F may include the substrate 10, the first level layer 110, the second level layer 120, the interlayer insulating layer 130, the hydrogen insulating layer 140, and a passivation layer 450. The first wire 112 may be formed in the first level layer 110. The second wire 114 may be formed in the first level layer 110. The third wire 122 may be formed in the second level layer 120. The semiconductor device 100F may further include the diffusion prevention layer 124, the contact plug 132, and the dummy contact plug 134. The dummy contact plug 134 may be electrically floated. Hereinafter, the descriptions already provided with reference to FIG. 2A may not be repeated.

The diffusion prevention layer 124 may contact the upper surface of the third wire 122; however, exemplary embodiments of the inventive concept are not limited thereto. The diffusion prevention layer 124 may contact the lower surface of the third wire 122. Alternatively, the diffusion prevention layer 124 may contact the lower surface and the side surfaces of the third wire 122. The diffusion prevention layer 124 may include insulating materials. The insulating materials of the diffusion prevention layer 124 may contact the upper surface of the second level layer 120 which includes the third wire 122. The dummy contact plug 134 may penetrate the diffusion prevention layer 124.

The passivation layer 450 may be formed on the hydrogen insulating layer 140. The hydrogen insulating layer 140 may include an oxide. The passivation layer 450 may include a nitride. For example, the passivation layer 450 may include a silicon nitride. The passivation layer 450 may prevent the hydrogen (H) ions in the hydrogen insulating layer 140 from being discharged to the outside.

Figure 8:
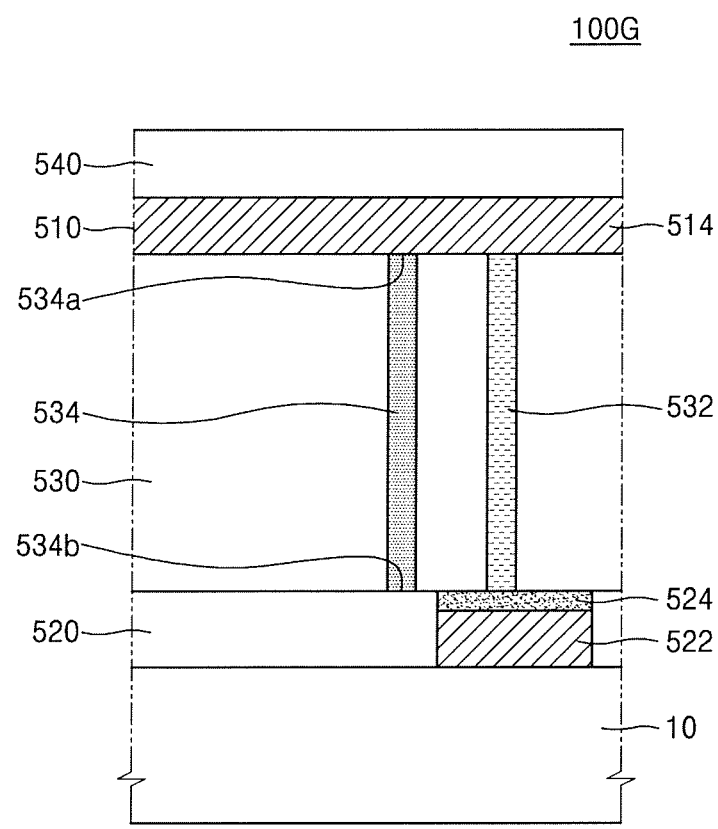
FIG. 8 is a side cross-sectional view along a line II-II' of FIG. 1 according to an exemplary embodiment of the inventive concept.

FIG. 8 is a side cross-sectional view along a line of FIG. 1 of a semiconductor device 100G according to an exemplary embodiment of the inventive concept.

Referring to FIG. 8, the semiconductor device 100G may include the substrate 10, a first level layer 510, a second level layer 520, an interlayer insulating layer 530, and a hydrogen insulating layer 540. A second wire 514 may be formed in the first level layer 510. A third wire 522 may be formed in the second level layer 520. The semiconductor device 100G may further include a diffusion prevention layer 524, a contact plug 532, and a dummy contact plug 534.

The first level layer 510 may be formed at a level above the second level layer 520 with respect to the substrate 10. The hydrogen insulating layer 540 may be formed at a level above the first level layer 510 with respect to the substrate 10.

The diffusion prevention layer 524 may contact an upper surface of the third wire 522; however, exemplary embodiments of the inventive concept are not limited thereto. The diffusion prevention layer 524 may contact only a lower surface of the third wire 522. Alternatively, the diffusion prevention layer 524 may contact the lower surface and side surfaces of the third wire 522. The diffusion prevention layer 524 may include insulating materials. The diffusion prevention layer 524 may contact the upper surface or the lower surface of the third wire 522. The dummy contact plug 534 may penetrate the diffusion prevention layer 524.

An upper surface 534a of the dummy contact plug 534 may contact the second wire 514. However, since a lower surface 534b of the dummy contact plug 534 might not contact the third wire 522 formed in the second level layer 520, the dummy contact plug 534 may be electrically floated.

Figure 9:
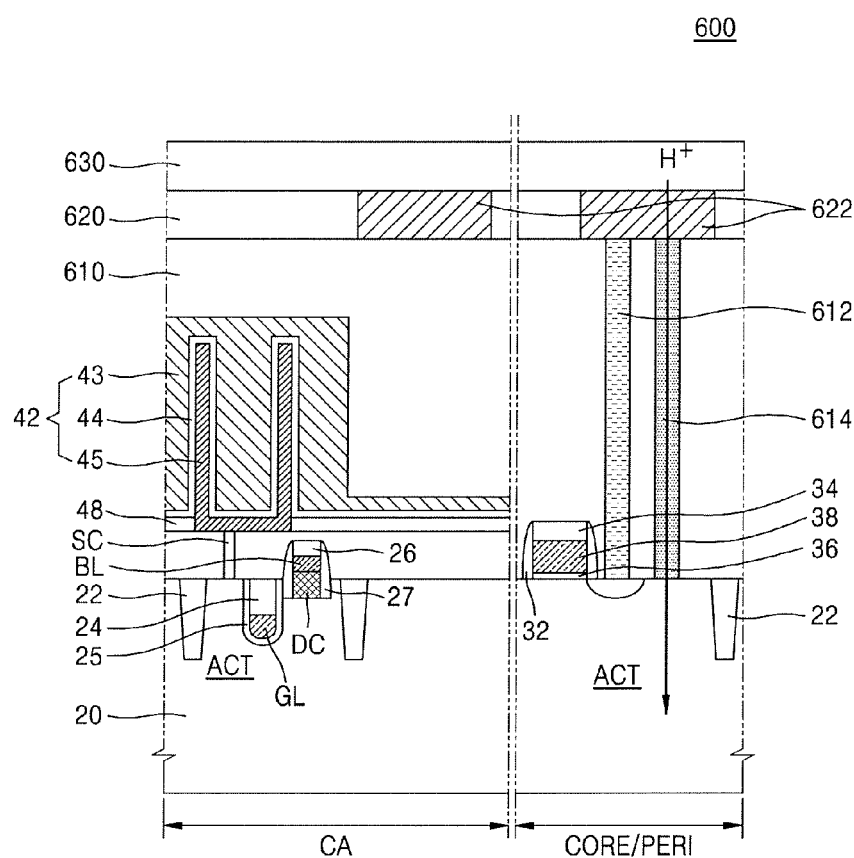
FIG. 9 is a side cross-sectional view illustrating a semiconductor device according to an exemplary embodiment of the inventive concept.

FIG. 9 is a side cross-sectional view of a semiconductor device 600 according to an exemplary embodiment of the inventive concept.

Referring to FIG. 9, the semiconductor device 600 may include a substrate 20 in which at least one unit element is formed, a first level layer 620, a hydrogen insulating layer 630, a first contact plug 612, and at least one first dummy contact plug 614. At least one unit element may be formed on and/or in the substrate 20.

The semiconductor device 600 may include a cell array area CA. The semiconductor device 600 may further include a peripheral circuit area CORE/PERI. Referring to FIG. 9, the cell array area CA may be located on a left side of the semiconductor device 600. The peripheral circuit area CORE/PERI may be located on a right side of the cell array area CA. However, exemplary embodiments of the inventive concept are not limited thereto. For example, the peripheral circuit area CORE/PERI may be located at an outer or edge area of the cell array area CA.

The cell array area CA may include active areas ACT. The active areas ACT may include an element isolation pattern 22, gate lines GL, and bit lines BL. Areas in which the gate lines GL are not formed may be a source area or a drain area. For example, in the source/drain area, a storage node contact SC may be formed. The storage node contact SC may electrically connect a capacitor to the source area or the drain area. A direct contact DC may be formed in the drain area. The direct contact DC may electrically connect the bit lines BL to the drain area. A bit-line capping film 26 and a bit-line spacer 27 may be formed. The bit-line capping film 26 and the bit-line spacer 27 may protect the bit lines BL.

A recessed channel array transistor may be formed on the gate line GL of the cell array area CA. A planar transistor may be formed in a gate line of the peripheral circuit area CORE/PERI. However, exemplary embodiments of the inventive concept are not limited thereto.

The active areas ACT may be isolated from each other. The element isolation pattern 22 may include an oxide film, a nitride film, or any combination thereof. However, exemplary embodiments of the inventive concept are not limited thereto. The element isolation pattern 22 may be a single layer including an insulating layer of a single type. Alternatively, the element isolation pattern 22 may be multiple layers including two or more types of insulating layers.

The active area ACT of the cell array area CA may include a first gate structure. The first gate structure may be formed within a trench having a certain depth from an upper surface of the substrate 20. The first gate structure may include a gate insulating layer 25, the gate lines GL, and a capping layer 24. The first interlayer insulating layer 610, the first level layer 620, and the hydrogen insulating layer 630 may be sequentially formed on the substrate 20. A detailed method of manufacturing the semiconductor device 600 will be described with reference to FIGS. 10A to 10E.

A first capacitor 42 may be formed in the cell array area CA. The first capacitor 42 may be electrically connected to the source area via the storage node contact SC. The first capacitor 42 may include an upper electrode, a dielectric layer 44, and a lower electrode 45. However, exemplary embodiments of the inventive concept are not limited thereto. Another device in which information may be stored, instead of the first capacitor 42, may be formed.

The peripheral circuit area CORE/PERI of the substrate 20 may include an active area ACT. The active area ACT may be defined by the element isolation pattern 22. The active area ACT may include second gate structures. The second gate structures may include a gate insulating layer 36, a gate electrode 38, a gate capping layer 34, and a gate spacer 32 which are sequentially stacked on the substrate 20. The at least one unit element may be the second gate structures including the gate insulating layer 36, the gate electrode 38, the gate capping layer 34, and the gate spacer 32. A source area and a drain area may be formed on side portions of the substrate 20 on which second gate structures are not provided. The first interlayer insulating layer 610 may be formed on the substrate 20.

The substrate 20 in which the at least one unit element is formed may be a semiconductor wafer. The substrate 20 may include silicon. According to an exemplary embodiment of the inventive concept, the substrate 20 may include a semiconductor element such as germanium (Ge). Alternatively, the substrate 20 may include compound semiconductors such as silicon carbide (SiC), gallium arsenide (GaAs), indium arsenide (InAs), and indium phosphide (InP); however, exemplary embodiments of the inventive concept are not limited thereto. According to an exemplary embodiment of the inventive concept, the substrate 20 may have a silicon-on-insulator (SOI) structure. For example, the substrate 20 may include a buried oxide layer (BOX). According to an exemplary embodiment of the inventive concept, the substrate 20 may include a conductive area. For example, the substrate 20 may include a conductive area doped with impurities or a structure doped with impurities. The substrate 20 may have various element isolation structures such as a shallow trench isolation (STI) structure.

The first level layer 620 may be formed on the substrate 20. The first level layer 620 may include at least one first wire 622. The at least one first wire 622 may include metallic materials, for example, copper (Cu), aluminum (Al), tungsten (W), titanium (Ti), titanium nitride (TiN), tungsten nitride (WN), tantalum (Ta), tantalum nitride (TaN), and titanium aluminum nitride (TiAlN), or any combination thereof. The at least one first wire 622 may be electrically connected to the at least one unit element formed in the substrate 20 via the first contact plug 612. Portions of the first level layer 620 except the at least one first wire 622 may include substantially the same material as the first interlayer insulating layer 610 or the hydrogen insulating layer 630.

The hydrogen insulating layer 630 may be formed on the first level layer 620. The hydrogen insulating layer 630 may include hydrogen (H) ions. The hydrogen insulating layer 630 may be formed on the substrate 20. The hydrogen insulating layer 630 may include hydrogen (H) ions. The hydrogen insulating layer 630 may be formed at a level above the first level layer 620 with respect to the substrate 20. The hydrogen insulating layer 630 may include insulating materials including hydrogen (H), for example, hydrogen silsesquioxane (HSQ), tetraethyl orthosilicate (TEOS), high density plasma chemical vapor deposited (HDP-CVD) oxide, or the like. The hydrogen insulating layer 630 may provide hydrogen (H) ions. The hydrogen insulating layer 630 may move the hydrogen (H) ions toward the substrate 20 via the dummy contact plug 614 or the like.

The first contact plug 612 may electrically connect the at least one unit element formed in the substrate 20 to the at least one first wire 622. Therefore, the first contact plug 612 may contact the source areas and the drain areas formed on the side portions of the substrate 20 on which the second gate structures are not stacked. A contact pad may be formed on a surface where the first contact plug 612 contacts the at least one first wire 622. The first contact plug 612 may include a conductive material, for example, aluminum (Al), copper (Cu), an aluminum-copper (Al—Cu) alloy, WSi, TiW, tantalum (Ta), molybdenum (Mo), tungsten (W), doped polysilicon (poly-Si), or any combination thereof. A shape of a cross-section of the first contact plug 612 may vary.

The at least one first dummy contact plug 614 may contact the at least one first wire 622. The at least one first dummy contact plug 614 may contact the substrate 20. The first dummy contact plug 614 may be spaced apart from other unit elements formed in the substrate 20. Accordingly, the first dummy contact plug 614 may be electrically separated from the at least one unit element formed in the substrate 20. The first dummy contact plug 614 may be electrically floated. The first dummy contact plug 614 may provide a movement path for the hydrogen (H) ions. The hydrogen (H) ions provided by the hydrogen insulating layer 630 may be delivered to the substrate 20 through the movement path provided by the first dummy contact plug 614.

The first dummy contact plug 614 may include substantially the same material as the first contact plug 612. The first dummy contact plug 614 and the first contact plug 612 may have substantially the same width; however, exemplary embodiments of the inventive concept are not limited thereto. A width of the first dummy contact plug 614 may be different than a width of the first contact plug 612. A shape of a cross-section of the first dummy contact plug 614 may vary.

The first interlayer insulating layer 610 may be formed between the first level layer 620 and the substrate 20. The at least one first dummy contact plug 614 and the first contact plug 612 may penetrate the first interlayer insulating layer 610. The first interlayer insulating layer 610 may include a single layer or multiple layers. The first interlayer insulating layer 610 may include an oxide. The interlayer insulating layer 130 may include boro-phospho-silicate glass (BPSG), tonen silazene (TOSZ), undoped silicate glass (USG), spin-on glass (SOG), flowable oxide (FOX), tetraethylortho silicate (TEOS), high density plasma chemical vapor deposition (HDP-CVD) oxide, hydrogen silisesquioxane (HSQ), or the like; however, exemplary embodiments of the inventive concept are not limited thereto.

FIGS. 10A to 10E are side cross-sectional views illustrating a method of manufacturing a semiconductor device 600 according to an exemplary embodiment of the inventive concept. Referring to FIGS. 10A to 10E, the method of manufacturing the semiconductor device 600 of FIG. 9 will be described.

Figure 10A:
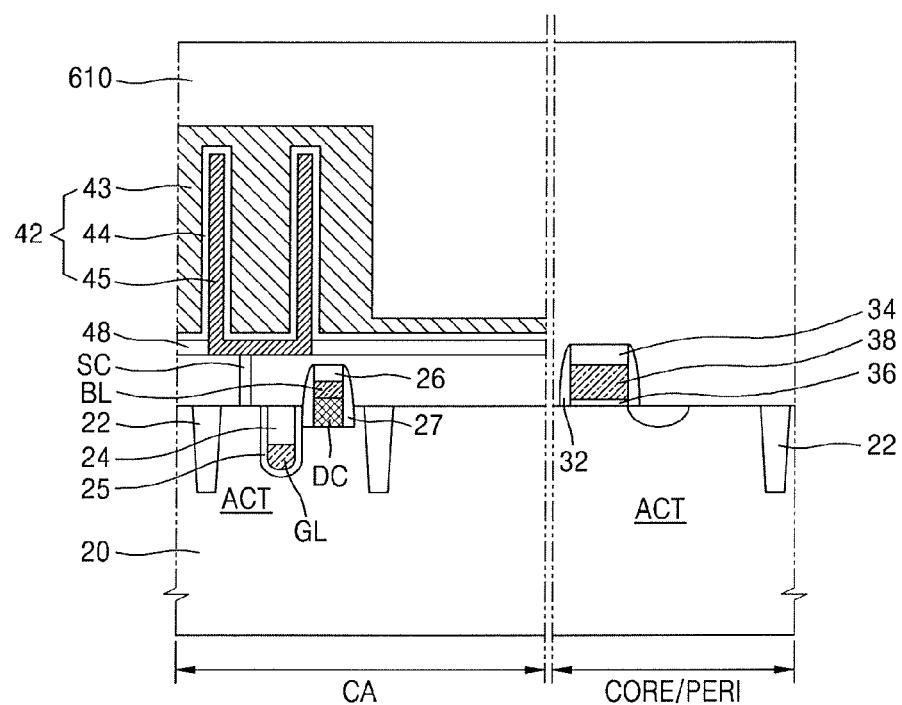
FIGS. 10A to 10E are side cross-sectional views illustrating a method of manufacturing a semiconductor device according to an exemplary embodiment of the inventive concept.

Referring to FIG. 10A, the first interlayer insulating layer 610 may be formed on the substrate 20 in which the at least one unit element is formed. The first interlayer insulating layer 610 may include the first capacitor 42, an etching stop layer 48, and the second gate structures. The second gate structures may include the gate insulating layer 36, the gate electrode 38, the gate capping layer 34, and the gate spacer 32. Portions of the first interlayer insulating layer 610 except portions corresponding to the first capacitor 42, the etching stop layer 48, and the second gate structures may be filled with insulating materials through CVD, PVD such as sputtering, ALD, or the like and plagiarized through etching or CMP. Accordingly, the first interlayer insulating layer 610 may be formed.

Figure 10B:
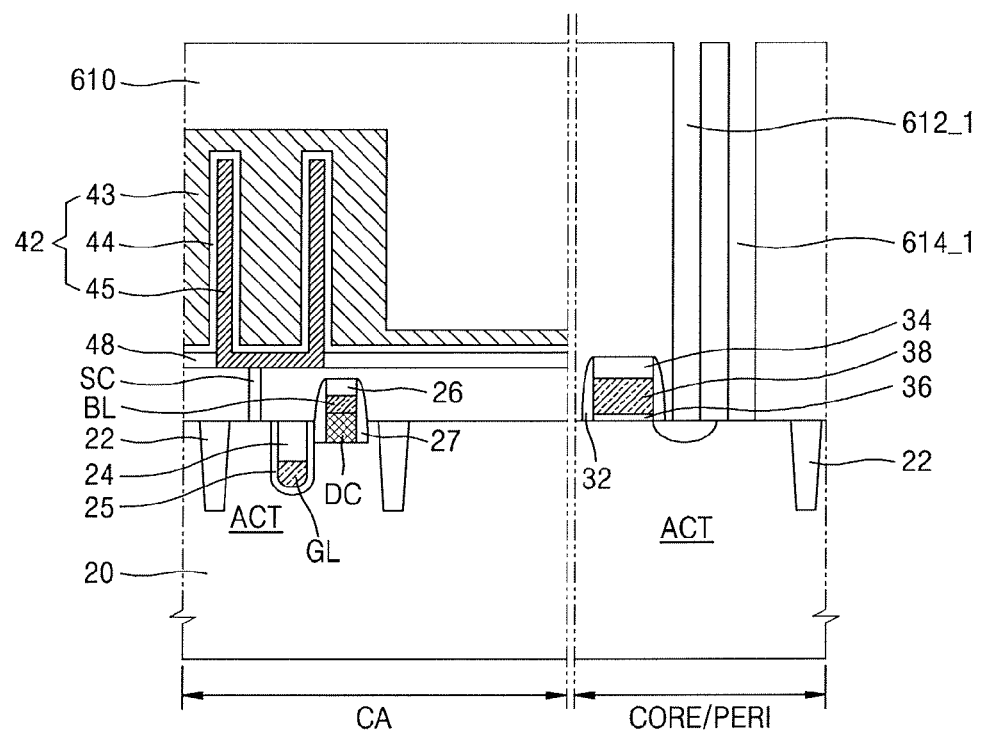

Referring to FIG. 10B, a first contact plug 612 and a first dummy contact plug 614 may be formed in the first interlayer insulating layer 610. The first contact plug 612 and the first dummy contact plug 614 may be formed by forming a photoresist pattern and etching an exposed portion of the first interlayer insulating layer 610 by using the photoresist pattern as a mask. The first contact plug 612 may be etched in a region that may be electrically connected to the at least one unit element formed in the substrate 20.

Figure 10C:
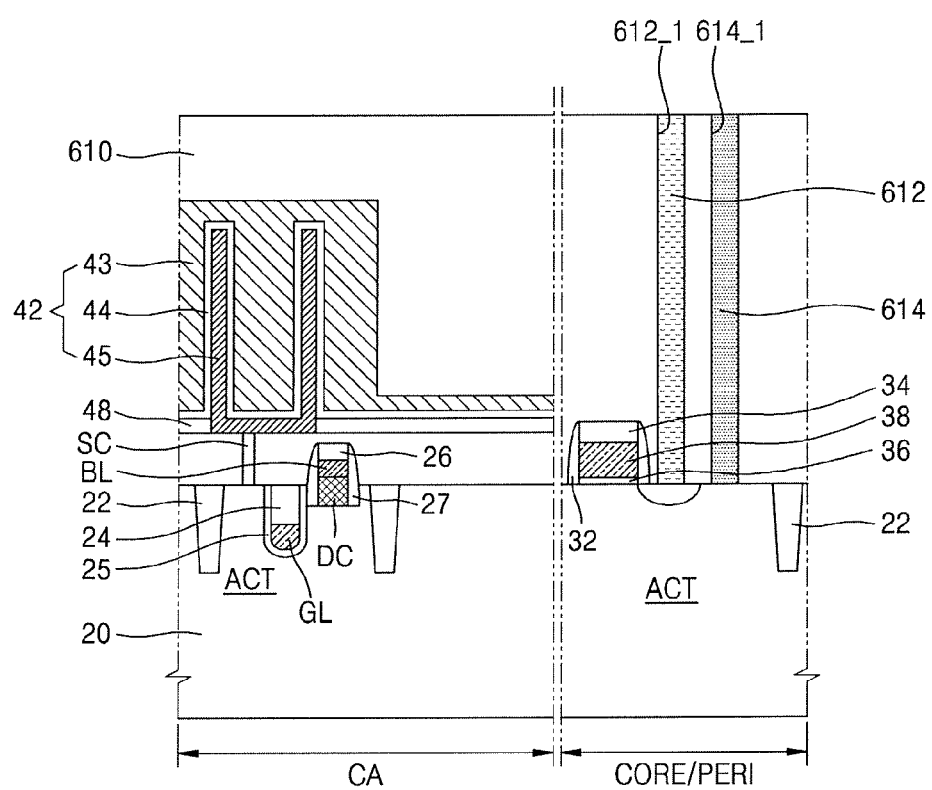

Referring to FIG. 10C, the first contact plug 612 and the first dummy contact plug 614 may be formed by burying the conductive material, for example, aluminum (Al), copper (Cu), an Al—Cu alloy, tungsten silicide (WSi), titanium tungsten (TiW), tantalum (Ta), molybdenum (Mo), tungsten (W), doped polysilicon (poly-Si), or any combination thereof; through CVD, PVD, ALD, or the like. According to an exemplary embodiment of the inventive concept, a metallic seed layer may be formed on inner walls of the first contact plug 612 and inner walls of the first dummy contact plug 614. The metallic seed layer may be grown. After the metallic seed layer is buried and grown, the first contact plug 612 and the first dummy contact plug 614 may be formed. The first contact plug 612 and the first dummy contact plug 614 may be planarized through CMP, etch back, or the like. The dummy contact plug 614 may be electrically floated.

Figure 10D:
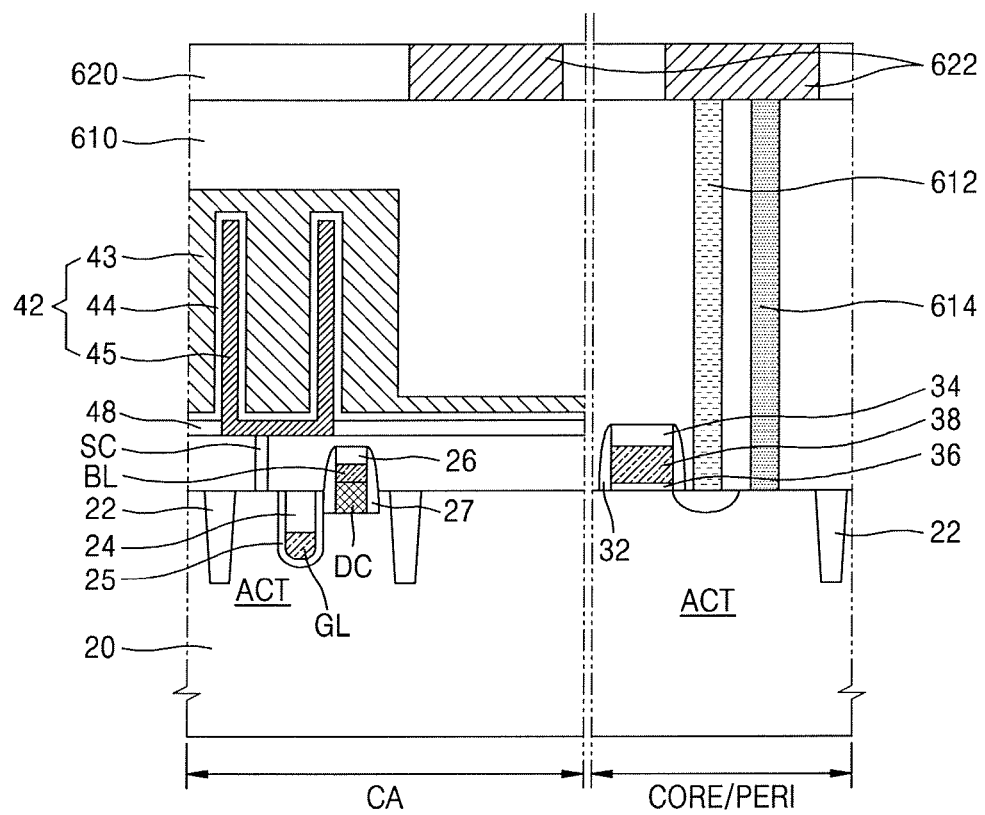

Referring to FIG. 10D, the first level layer 620 including the at least one first wire 622 may be formed on the first interlayer insulating layer 610. The at least one first wire 622 may be formed by forming a wire material film through CVD, PVD, ALD, or the like. The wire material film may be patterned through photolithography. A space between the at least one first wire 622 may be filled with insulating materials and may be planarized through etching or CMP.

Alternatively, when the at least one first wire 622 includes copper (Cu), a damascene process or a dual damascene process may be used. The at least one first wire 622 may have substantially the same width or different width as of the first wires 622.

Figure 10E:
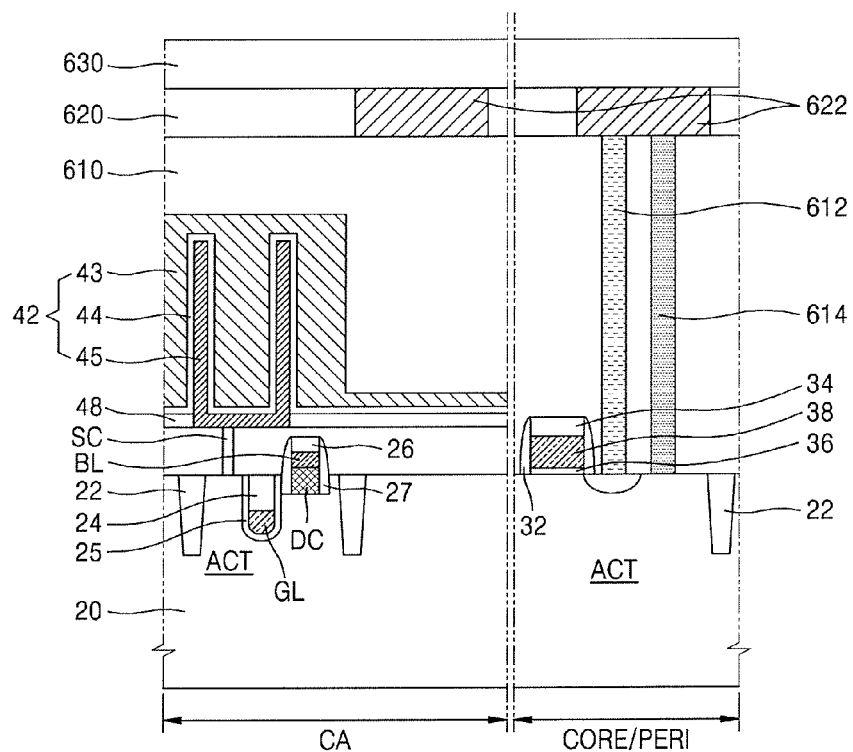

Referring to FIG. 10E, the hydrogen insulating layer 630 may be formed on the first level layer 620. The hydrogen insulating layer 630 may include hydrogen (H). For example, the hydrogen insulating layer 630 may be a high density plasma (HDP) oxide layer including hydrogen (H). The hydrogen insulating layer 630 may be formed through chemical vapor deposition (CVD) after oxygen and silane gas are provided. As such, hydrogen (H) may remain in the hydrogen insulating layer 630. The hydrogen insulating layer 630 may be porous.

Figure 11:
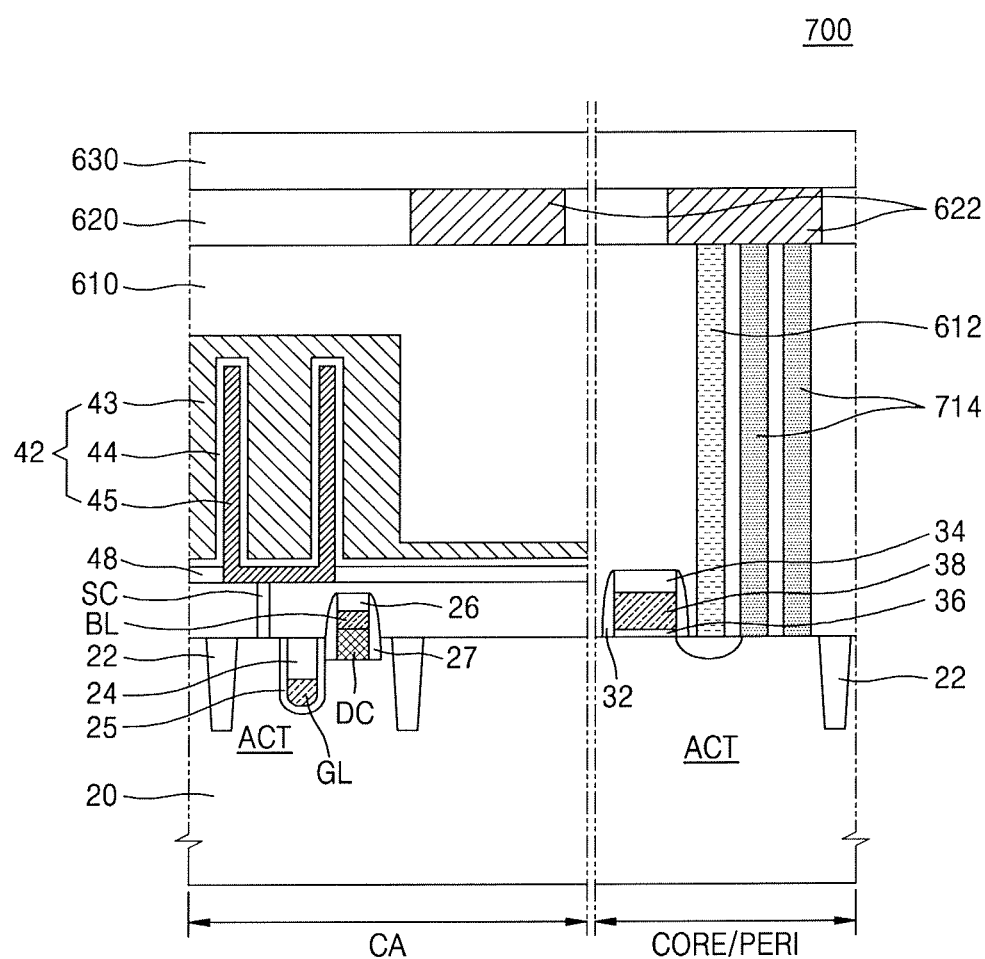
FIG. 11 is a side cross-sectional view illustrating a semiconductor device according to an exemplary embodiment of the inventive concept.

FIG. 11 is a side cross-sectional view illustrating a semiconductor device 700 according to an exemplary embodiment of the inventive concept. Hereinafter, the descriptions that are provided with reference to FIG. 9 may not be repeated.

Referring to FIG. 11, the semiconductor device 700 may include the substrate 20, the first level layer 620, the hydrogen insulating layer 630, the first contact plug 612, and at least one first dummy contact plug 714. The substrate 20 may include the at least one unit element. The first level layer 620 may include the at least one first wire 622. The semiconductor device 700 may include a plurality of first dummy contact plugs 714. A portion of the first dummy contact plugs 714 may contact the active area ACT in the peripheral circuit areas CORE/PERI of the substrate 20. As illustrated in FIG. 11, the semiconductor device 700 may include two first dummy contact plugs 714; however, exemplary embodiments of the inventive concept are not limited thereto. Accordingly, the semiconductor device 700 may include two or more first dummy contact plugs 714. As illustrated in FIG. 11, substantially all of the first dummy contact plugs 714 may contact the active area ACT in the peripheral circuit areas CORE/PERI; however, exemplary embodiments of the inventive concept are not limited thereto. For example, a portion of the first dummy contact plugs 714 may contact the element isolation pattern 22.

Figure 12:
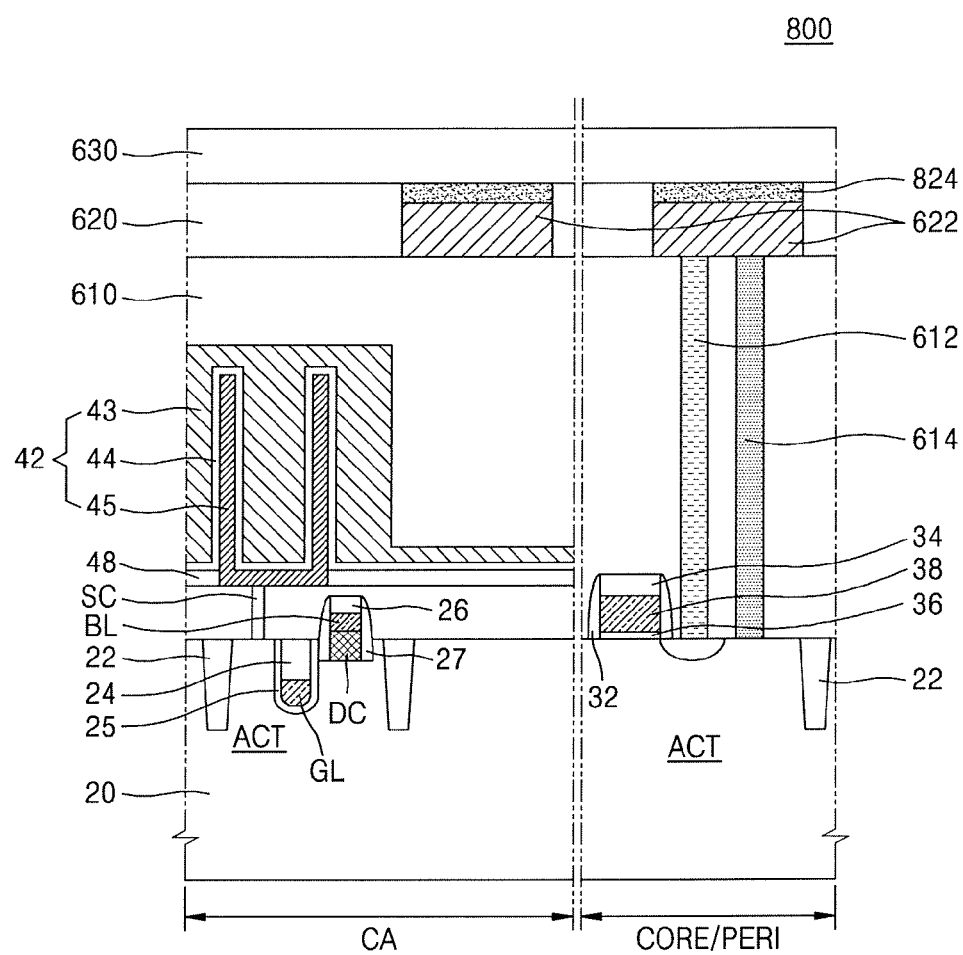
FIG. 12 is a side cross-sectional view illustrating a semiconductor device according to an exemplary embodiment of the inventive concept.

FIG. 12 is a side cross-sectional view illustrating a semiconductor device 800 according to an exemplary embodiment of the inventive concept. Hereinafter, the descriptions that are provided with reference to FIG. 9 may not be repeated.

Referring to FIG. 12, the semiconductor device 800 may include the substrate 20, the first level layer 620, the hydrogen insulating layer 630, the first contact plug 612, at least one dummy contact plug 614, and a diffusion prevention layer 824. The substrate 20 may include the at least one unit element. The first level layer 620 may include the at least one first wire 622. The diffusion prevention layer 824 may contact the at least one first wire 622.

The diffusion prevention layer 824 may prevent metallic materials included in the at least one first wire 622 from diffusing during a manufacturing process of the semiconductor device 800. The diffusion prevention layer 824 may cover an upper surface of the at least one first wire 622. However, exemplary embodiments of the inventive concept are not limited thereto.

The diffusion prevention layer 824 may include a metallic material such as titanium (Ti) and tantalum (Ta). Alternatively, the diffusion prevention layer 824 may include a nitride such as titanium nitride (TiN), tantalum nitride (TaN), and cobalt nitride (CoN), or any combination thereof. However, exemplary embodiments of the inventive concept are not limited thereto. The diffusion prevention layer 824 may disturb a flow of hydrogen (H) ions provided by the hydrogen insulating layer 630.

Figure 13:
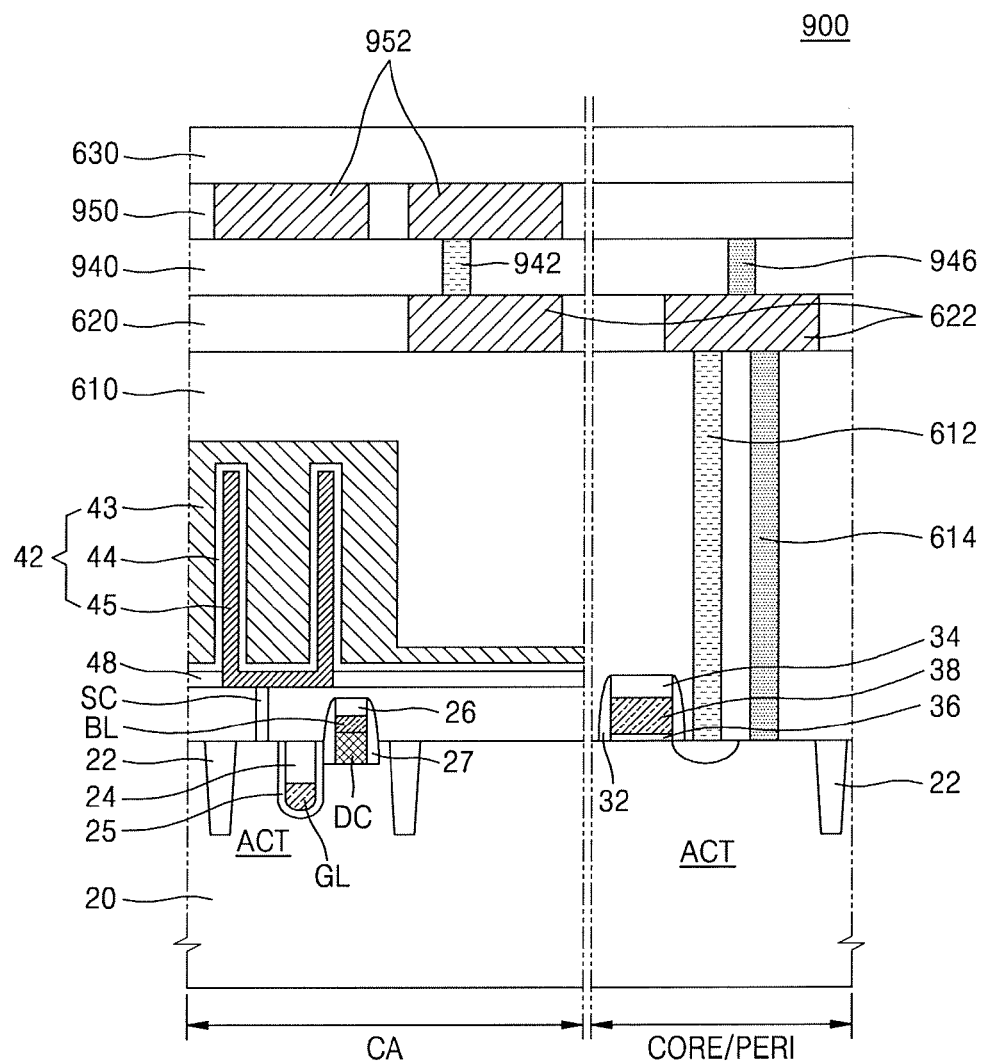
FIG. 13 is a side cross-sectional view illustrating a semiconductor device according to an exemplary embodiment of the inventive concept.

FIG. 13 is a side cross-sectional view illustrating a semiconductor device 900 according to an exemplary embodiment of the inventive concept.

Referring to FIG. 13, the semiconductor device 900 may include the substrate 20, the first level layer 620, the hydrogen insulating layer 630, the first contact plug 612, and at least one dummy contact plug 614. The substrate 20 may include the at least one unit element. The first level layer 620 may include the at least one first wire 622.

The semiconductor device 900 may further include a second level layer 950, a second interlayer insulating layer 940, a second contact plug 942, and a second dummy contact plug 946. The second level layer 950 may be formed between the first level layer 620 and the hydrogen insulating layer 630. The second interlayer insulating layer 940 may be formed between the first level layer 620 and the second level layer 950.

The second level layer 950 may include at least one second wire 952. Materials of the second level layer 950 and a method of forming the second level layer 950 may be substantially the same as the materials of the first level layer 620 and the method of forming the first level layer 620 described above.

Materials of the second interlayer insulating layer 940 and a method of forming the second interlayer insulating layer 940 may be substantially the same as the materials of the first interlayer insulating layer 610 and the method of forming the first interlayer insulating layer 610 described above.

The second contact plug 942 may penetrate the second interlayer insulating layer 940. Therefore, the second contact plug 942 may electrically connect the at least one first wire 622 and the at least one second wire 952 to each other. Materials of the second contact plug 942 and a method of forming the second contact plug 942 may be substantially the same as the materials of the first contact plug 612 and the method of forming the first contact plug 612 described above.

The second dummy contact plug 946 may contact the first level layer 620 and the second level layer 950 by penetrating the second interlayer insulating layer 940. The second dummy contact plug 946 may be electrically floated. As illustrated in FIG. 13, the second dummy contact plug 946 may contact the at least one first wire 622. The second dummy contact plug 946 may be spaced apart from the at least one second wire 952. However, exemplary embodiments of the inventive concept are not limited thereto. The second dummy contact plug 946 may be spaced apart from the at least one first wire 622. The second dummy contact plug 946 may contact the at least one second wire 952. Alternatively, the second dummy contact plug 946 may be spaced apart from the at least one first wire 622 and the at least one second wire 952. Materials of the second dummy contact plug 946 and a method of forming the second dummy contact plug 946 may be substantially the same as the materials of the first dummy contact plug 614 and the method of forming the first dummy contact plug 614 described above.

Exemplary embodiments of the inventive concept of the semiconductor devices 100A, 100B, 100C, 100D, 100F, and 1000 may be applied to the semiconductor devices 600, 700, 800, and 900, or vice versa.

Figure 14:
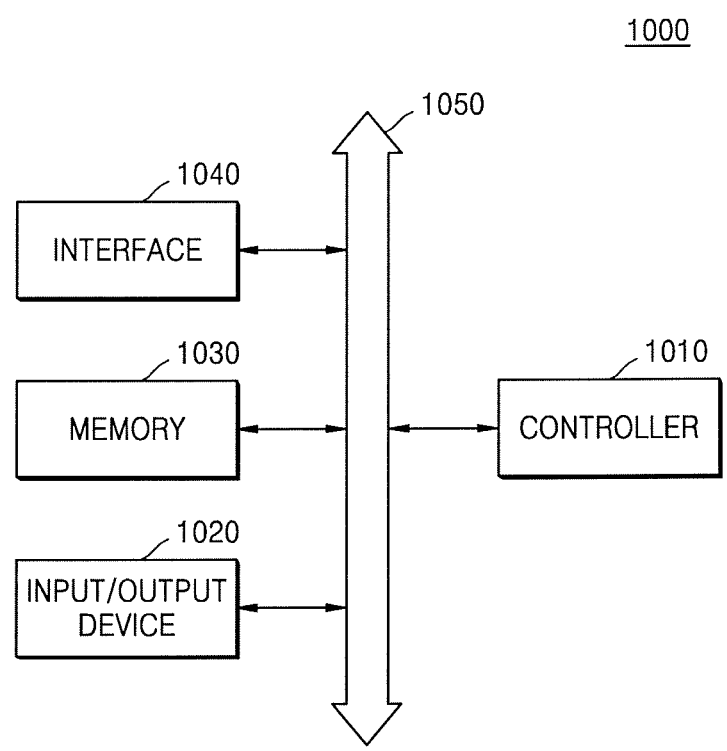
FIG. 14 is a block diagram illustrating a system including a semiconductor device according to an exemplary embodiment of the inventive concept.

FIG. 14 is a block diagram of a system 1000 including a semiconductor device according to an exemplary embodiment of the inventive concept.

The system 1000 may include a controller 1010, an input/output device 1020, a memory 1030, and an interface 1040. The system 1000 may be a mobile system. The system 1000 may be a system that transmits or receives information. According to an exemplary embodiment of the inventive concept, the mobile system may be a personal digital assistant (PDA), a portable computer, a web tablet, a wireless phone, a mobile phone, a digital music player, or a memory card. The controller 1010 may control execution programs in the system 1000. The controller 1010 may be a microprocessor, a digital signal processor, a microcontroller, or the like. The input/output device 1020 may be used to input or output data of the system 1000. The system 1000 may be connected to an external device, for example, a personal computer or a network. The system 1000 may be connected to the external device by using the input/output device 1020. The system 1000 may exchange data with the external device. The input/output device 1020 may be, for example, a keypad, a keyboard, or a display.

The memory 1030 may store codes and/or data for operating the controller 1010. The memory 1030 may also store data processed by the controller 1010. The memory 1030 may include a semiconductor device according to exemplary embodiments of the inventive concept. For example, the memory 1030 may include at least one of the semiconductor devices 100A, 100B, 100C, 100D, 100E, 100F, 1000, 600, 700, 800 and 900 described with reference to FIGS. 2A to 13.

The interface 1040 may be a path via which data may be exchanged between the system 1000 and another external device. The controller 1010, the input/output device 1020, the memory 1030, and the interface 1040 may communicate with each other via a bus 1050. The system 1000 may be used in a mobile phone, an MP3 player, a navigation device, a portable multimedia player (PMP), solid state disk (SSD), or household appliances Exemplary embodiments of the present inventive concept have been described with reference to the figures, it will be understood by those of ordinary skill in the art that various changes in form and details may be made therein without departing from the spirit and scope of the present inventive concept as defined by the following claims.

What is claimed is:
1. A semiconductor device, comprising:
a substrate;
a hydrogen insulating layer disposed on the substrate, the hydrogen insulating layer comprising hydrogen ions;
a first level layer disposed on the substrate, the first level layer comprising a first wire and a second wire;

a second level layer disposed on the substrate and at a different level from the first level layer, the second level layer comprising a third wire;
an interlayer insulating layer disposed between the first level layer and the second level layer;
a diffusion prevention layer contacting the third wire;
a contact plug penetrating the interlayer insulating layer and electrically connecting the second wire to the third wire; and
a dummy contact plug penetrating the interlayer insulating layer,
wherein the dummy contact plug is not connected to the third wire and the diffusion prevention layer, and
wherein the dummy contact plug contacts the first level layer and the second level layer, is spaced apart from the diffusion prevention layer in a horizontal direction in a plan view, and is configured to provide a movement path for the hydrogen ions in the hydrogen insulating layer.

2. The semiconductor device of claim 1, wherein the second level layer is higher than the first level layer, and
the hydrogen insulating layer is higher than the second level layer.

3. The semiconductor device of claim 2, wherein a lower surface of the dummy contact plug contacts the first wire.

4. The semiconductor device of claim 2, wherein an upper surface of the dummy contact plug is lower than an upper surface of the contact plug.

5. The semiconductor device of claim 2, wherein the diffusion prevention layer covers a lower surface and side surfaces of the third wire.

6. The semiconductor device of claim 2, wherein the diffusion prevention layer comprises an insulating material comprising a nitride,
the diffusion prevention layer contacts at least a portion of the second level layer, and
the dummy contact plug penetrates the diffusion prevention layer.

7. The semiconductor device of claim 2, wherein the hydrogen insulating layer comprises an oxide, and
the semiconductor device further comprises a passivation layer disposed on the hydrogen insulating layer, the passivation layer comprising a nitride.

8. The semiconductor device of claim 1, wherein the first level layer is higher than the second level layer, and
the hydrogen insulating layer is higher than the first level layer.

9. The semiconductor device of claim 8, wherein an upper surface of the dummy contact plug contacts the second wire.

10. The semiconductor device of claim 1, wherein the dummy contact plug includes substantially a same material as the contact plug.

11. The semiconductor device of claim 1, wherein the diffusion prevention layer includes a metallic material.

12. The semiconductor device of claim 1, wherein the first wire and the second wire have substantially a same width, and the widths of the first and second wires are different than a width of the third wire.

13. The semiconductor device of claim 1, wherein the contact plug includes a conductive material.

14. The semiconductor device of claim 1, wherein the first and second wires include substantially a same material as the interlayer insulating layer.

* * * * *